United States Patent [19]

Rich et al.

[11] Patent Number: 5,187,809
[45] Date of Patent: Feb. 16, 1993

[54] DUAL MODE AUTOMATIC GAIN CONTROL

[75] Inventors: Randall Wayne Rich, Palatine; Rashid Masood Osmani, Carol Stream; Thomas J. Walczak, Woodstock; Stephen V. Cahill, Palatine, all of Ill.

[73] Assignee: Motorola, Inc., Schaumburg, Ill.

[21] Appl. No.: 896,462

[22] Filed: Jun. 8, 1992

Related U.S. Application Data

[63] Continuation of Ser. No. 572,080, Aug. 24, 1990, abandoned.

[51] Int. Cl.$^5$ ............................................. H04B 1/38
[52] U.S. Cl. .......................................... 455/33.1; 455/73; 455/89; 455/234.2; 455/247.1; 455/324; 379/59; 375/5; 375/98; 370/95.3
[58] Field of Search ............... 455/33.1, 34.1, 34.2, 455/56.1, 17, 73, 89, 234.1, 234.2, 247.1, 250.1, 324; 375/5, 85, 98; 370/11, 95.3; 379/59

[56] References Cited

U.S. PATENT DOCUMENTS

| | | | |
|---|---|---|---|
| 4,355,401 | 10/1982 | Ikoma et al. | 375/5 |
| 4,476,585 | 10/1984 | Reed | 455/324 |
| 4,521,892 | 6/1985 | Vance et al. | 370/11 |
| 4,757,502 | 7/1988 | Meuriche et al. | 370/95.3 |
| 4,829,593 | 5/1989 | Hara | 455/234 |
| 4,914,651 | 5/1990 | Lusignan | 455/33 |
| 5,008,953 | 4/1991 | Dahlin et al. | 375/5 |
| 5,020,076 | 5/1991 | Cahill et al. | 375/5 |

FOREIGN PATENT DOCUMENTS 9006644  6/1990  PCT Int'l Appl. ............... 455/234

Primary Examiner—Reinhard J. Eisenzopf
Assistant Examiner—Andrew Faile
Attorney, Agent, or Firm—Robert H. Kelly

[57] ABSTRACT

A gain control system for controlling signal levels of the signal received by a receiver. The gain control system is operable to control the signal levels of the signal when the signal is comprised of either a conventional, constant envelope signal, such as an FM signal, or a non-constant envelope signal, such as a TDMA composite modulated signal. The gain control system may be advantageously embodied in a dual-mode radiotelephone operable to receive both conventional, FM signals and TDMA, composite modulated signals.

18 Claims, 5 Drawing Sheets

DUAL MODE AUTOMATIC GAIN CONTROL

This is a continuation of application Ser. No. 572,080, filed Aug. 24, 1990 and now abandoned.

BACKGROUND OF THE INVENTION

The present invention relates generally to automatic gain control apparatus, and, more particularly, to an automatic gain control system for a receiver capable of controlling signal levels of either a constant envelope information signal, or a non-constant envelope information signal when received thereat.

A radio communication system is comprised, at minimum, of a transmitter and a receiver. The transmitter and the receiver are interconnected by a radio-frequency channel to permit transmission of an information signal therebetween.

Typically, the information signal is impressed upon a radio-frequency electromagnetic wave by a process referred to as modulation to permit transmission of the information signal between the transmitter and the receiver. The radio-frequency electromagnetic wave is referred to as a carrier wave which is of a particular frequency, and the carrier wave, once modulated by the information signal, is referred to as a modulated, information signal. The modulated information signal may be transmitted through free space to transmit thereby the information between the transmitter and the receiver.

Various modulation techniques have been developed to modulate the information signal upon the electromagnetic wave. Amplitude modulation (AM), frequency modulation (FM), phase modulation (PM), and composite modulation (CM) are four of such modulation techniques.

In general, an amplitude modulated signal is formed by impressing (i.e., modulating) an information signal upon a carrier wave such that the information signal modifies the amplitude of the carrier wave corresponding to the value of the information signal. Amplitude modulation does not cause the frequency of the carrier wave to vary, and the information portion of the modulated information signal is contained in the shape, i.e., amplitude, of the signal. The shape of the modulated information signal is referred to as the envelope of the signal, and the changes in the amplitude of the information signal change the shape of the envelope formed thereby.

A frequency modulated signal formed is formed by impressing (i.e., modulating) an information signal upon a carrier wave such that the information signal modifies the frequency of the carrier wave corresponding to the value of the information signal. Frequency modulation does not cause the amplitude of the carrier wave to vary, and the information content of the modulated information signal is contained in the variation of the frequency of the signal. Because the amplitude of a frequency modulated signal does not vary, a frequency modulated signal is referred to as a constant envelope signal.

A phase modulated signal is formed by impressing (i.e., modulating) an information signal upon a carrier wave such that the information signal modifies the phase of the carrier wave corresponding to the value of the information signal. Phase modulation does not cause the amplitude of the carrier wave to vary. The information content of the modulated information signal is contained in the variation of the phase of the signal. Because the amplitude of a phase modulated information signal, similar to that of a frequency modulated signal, does not vary, a phase modulated signal is referred to as a constant envelope signal.

A composite modulated signal is formed by impressing (i.e., modulating) an information signal upon a carrier wave such that the information signal modifies both the amplitude and the phase of the carrier wave. Conventionally, in order to form the composite modulated signal, the carrier wave is first separated into sine wave and cosine wave component portions. Separate portions, referred to as the in-phase (or I) and the quadrature (or Q) components, of the information signal are impressed upon the cosine wave and sine wave component portions of the carrier wave. (More particularly, the in-phase component of the information signal is impressed upon the cosine wave component of the carrier wave, and the quadrature component of the information signal is impressed upon the sine wave component of the carrier wave.) The sine wave and cosine wave components are then recombined, and the resultant signal, the composite modulated signal, varies in both amplitude, and, additionally, phase. Composite modulation is advantageous in that a composite modulated signal permits a greater amount of information to be transmitted within a frequency bandwidth than a signal generated by any of the previously mentioned modulation techniques.

A receiver which receives a modulated information signal, such as a one formed by one of the above-described modulation techniques, includes circuitry to detect, or otherwise to recreate, the information signal modulated upon the carrier wave. This process is referred to as demodulation. As many different modulated information signals may be simultaneously transmitted by a plurality of transmitters at a plurality of different frequencies, a receiver contains tuning circuitry to demodulate only those signals received by the receiver which are of certain desired frequencies. The broad range of frequencies at which modulated information signals may be transmitted is referred to as the electromagnetic frequency spectrum. Regulation of radio-frequency communications in certain frequency bands of the electromagnetic frequency spectrum minimizes interference between simultaneously transmitted signals.

For example, portions of a 100 MHz band of the electromagnetic frequency spectrum (extending between 800 MHz and 900 MHz) are allocated for radiotelephone communication, such as, for example, communication effectuated by radiotelephones utilized in a cellular, communication system. Existing radiotelephones contain circuitry both to generate and to receive radio-frequency modulated information signals.

A cellular, communications system is created by positioning numerous base stations at spaced-apart locations throughout a geographical area. Each of the base stations is constructed to receive and to transmit modulated information signals simultaneously to and from radiotelephones to permit two-way communication therebetween.

The base stations are positioned at locations such that a radiotelephone at any location throughout the geographical area is within the reception range of at least one of the base station receivers. The geographical area is divided into portions, and one base station is positioned in each portion. Each portion of the geographical area defined thereby is referred to as a "cell".

Although numerous modulated information signals may be simultaneously transmitted at different transmission frequencies, each modulated information signal, when transmitted, occupies a finite portion of the frequency band. Overlapping of simultaneously transmitted modulated, information signals in the same geographic area is impermissible as interference between overlapping signals at the same frequency could prevent detection of either of the transmitted modulated information signals by a receiver.

To prevent such overlapping, the frequency band allocated for radiotelephone communication is divided into channels, each of which is of a 30 KHz bandwidth. A first portion, extending between 824 MHz and 849 MHz of the frequency band, is allocated for the transmission of modulated information signals from a radiotelephone to a base station. A second portion, extending between 869 MHz and 894 MHz of the frequency band is allocated for the transmission of modulation information signals from a base station to a radiotelephone.

Increased usage of cellular, communication systems has resulted, in many instances, however, in the full utilization of every available transmission channel of the frequency band allocated for cellular, radiotelephone communication. Other frequency bands of the electromagnetic frequency spectrum are oftentimes similarly fully utilized.

Various attempts have been made to utilize more efficiently the frequency band allocated for radiotelephone communications to increase thereby the information transmission capacity of a cellular, radiotelephone communication system. Attempts have been similarly made to use more efficiently other frequency bands of the electromagnetic frequency spectrum.

Conventionally, the modulation technique utilized by radiotelephone communication systems to form the modulated information signal thereby is frequency modulation. As mentioned previously, a frequency modulated signal impresses an information signal upon a carrier wave to modify the frequency of the carrier wave according to the value of the information signal. However, conventional frequency modulation techniques form a continuous-wave, FM modulated signal, and only one such continuous-wave signal may be transmitted upon a transmission channel at a time.

Techniques have been developed, which permit transmission of more than one signal at the same frequency. One such technique involves the sequential time-sharing of a single channel by several radiotelephones. This technique is referred to as time-domain multiple access (or TDMA).

In order to use TDMA, an information signal (such as a voice signal) which is to be transmitted is first encoded according to an encoding scheme. Once encoded, the information signal, in encoded form, is modulated upon a carrier wave and is transmitted in intermittent bursts. Other information signals may similarly be encoded, modulated, and transmitted in intermittent bursts at the same frequency. Thus, a greater number information signals may be transmitted within a particular frequency bandwidth. When the information signals are generated by users of radiotelephones forming a portion of a cellular communications system, a greater number of radiotelephones may be operated within a particular frequency bandwidth when such a TDMA technique is utilized.

A receiver constructed to receive a TDMA signal, such as a TDMA composite modulated signal, reconstructs the original information signal by decoding the TDMA signal transmitted to the receiver in intermittent bursts.

A system which utilizes composite modulated signals which are transmitted utilizing the TDMA technique has been chosen for a system to augment existing U.S. domestic cellular telephone systems. Compatability between existing domestic cellular telephone systems and the proposed system is necessary to permit equipment constructed for use on the proposed system also to be used on the existing systems. Thus, radiotelephones are being constructed which are capable of receiving both FM, continuous-wave signals, and TDMA composite-modulated signals. Such radiotelephones may be suitably operated in a conventional cellular communication system which utilizes FM continuous-wave signals, and in a cellular, communication system which utilizes TDMA composite-modulated signals.

A receiver constructed to receive TDMA composite-modulated signals may also require circuitry to perform equalization in the receiver. Equalizer circuitry is required to correct for delay problems associated with reflections of signals transmitted to the receiver which arrive at the receiver at different times. Because the signal received by a receiver is actually a vector sum of all signals transmitted at a particular frequency, the signal received by a receiver may actually be comprised of the same signal at different times as the signal may be reflected off objects prior to reception thereof by the receiver. The signal actually received by the receiver is, therefore, the sum of all signals which are transmitted to the receiver along many different paths. The path lengths may vary, and hence the signal actually received by the receiver may vary, responsive to repositioning of the receiver. Equalizer circuitry is oftentimes formed by a processor having an appropriate software algorithm embodied therein. In order to permit optimal operation of the equalizer circuitry, the receiver should be constructed to be linear (i.e., the demodulated signals should represent accurately the original I and Q portions modulated onto the carrier).

The linearity of a receiver defines the efficiency of the recreation of a received signal. An ideal receiver reproduces only the signal transmitted thereto. Actual, nonideal receivers, through a process of amplification and mixing occurring during frequency conversion of a received signal, produce intermodulation distortion. Associated with intermodulation distortion are undesired spurious signals generated during frequency conversion of a signal received by a nonideal receiver. Such undesired, spurious signals are referred to hereinbelow as intermodulation spurs. A highly nonlinear receiver generates a large amount of intermodulation distortion.

Typically, receivers, including those utilized in a conventional, cellular radiotelephone communication systems, minimize the deleterious effects caused by the generation of intermodulation spurs by including, as a portion of the receiver circuitry, filter circuits to filter the undesired signals and reduce the level of intermodulation spurs generated during frequency conversion of a received signal. Such filters may be comprised of either active or passive filter stages. An active filter stage may be advantageously embodied in an integrated circuit, but an active filter is generally linear over only a limited dynamic range of received signals. Additionally, an active filter exhibits proper filter characteristics over only the limited dynamic range.

As noted hereinabove, because a modulated information signal transmitted at a particular frequency may be reflected off objects prior to reception thereof by a receiver, the signal received is actually the sum of many signals received from many different paths. Hence, the signal level (i.e. amplitude) of the received signal is actually the vector sum of many signals received from many paths. The number of, and intensity of, signals actually received by a receiver may vary over time as a result of repositioning of the receiver, or of the objects from which a transmitted signal is reflected. As a result, the signal level of a received FM signal varies over time. This variance is referred to as "fading" of the signal. The rate at which the resultant signal strength at the receiver varies is predominantly determined by how rapidly the receiver is moving through its environment, and the frequency of the channel being used. For instance, in the cellular frequency band, and when a cellular radiotelephone is positioned in a vehicle travelling at sixty miles per hour, the signal strength of the received signal can vary by approximately twenty decibels during a five millisecond period.

Conventional FM receivers utilize voltage limiters prior to signal demodulation which clip the received signal. The resultant signal is of a constant envelope, and the deleterious effects of fading are thereby minimized. Since the information in an FM signal is not carried in the envelope, clipping the received signal to form a signal of a constant envelope permits optimal recovery of the frequency modulation, and, hence, the information content, of the received signal. Gain control of an FM-only, continuous-wave receiver is not necessary for demodulation, though such gain control may be utilized to adjust the received signal level to permit optimal operation of amplification and filtering circuitry within the receiver.

Receivers constructed to receive a TDMA composite-modulated information signal, however, require gain control circuitry to correct for the effects of changes in signal levels induced by fading, and to allow recovery of the information components encoded in the envelope of the signal.

Because radiotelephones being constructed to permit demodulation of TDMA composite-modulated signals are also to permit demodulation of conventional, continuous-wave signals, the radiotelephone must be constructed to contain gain control circuitry to correct for the effects of changes in signal levels of TDMA composite-modulated signals. Such gain control circuitry may also serve to ensure optimal performance of the receiver during reception of continuous-wave signals. The form and performance of gain control circuitry may vary, though, depending on the type of modulation being received.

When a composite modulated signal is received, gain control circuitry should be of a design to permit rapid and continuous tracking of variations in received signal levels due to fading. In addition, a radiotelephone which generates a TDMA composite modulated signal to transmit an information signal in a cellular communication system also measures intermittently the signal strengths of transmitters located in one or more cells. This process of testing signal strengths is referred to as mobile-assisted hand-off (or MAHO). The MAHO test also requires gain control circuitry which permits rapid and continuous tracking of a signal.

Digital signal processors may be utilized to form such rapid-tracking, gain control circuitry. However, digital signal processors require significant amounts of power for operation. Cellular, radiotelephone equipment may be battery powered; for such equipment, continuous use of digital signal processing circuitry to perform gain control may create an undesirable power load on the battery when the receiver receives a continuous-wave FM signal.

When receiving an FM-modulated signal, the gain control circuitry need not be of a design to track fading (i.e., the gain control circuitry need not permit rapid and continuous tracking). A normal FM limiter demodulator is insensitive to the variations induced by fading, and the aforementioned MAHO operation is not performed during continuous-wave reception. For continuous-wave reception, slow-responding gain control circuitry constructed with analog circuit elements which require only low power for operation thereof is possible.

A radiotelephone operable to receive both conventional continuous-wave signals, and TDMA composite-modulated signals having gain control circuitry for controlling signal levels of either type of transmitted signal, and, additionally, having minimal power consumption requirements would be advantageous.

What is needed, therefore, is a gain control scheme which requires minimal power consumption, but which also may be alternately operated to control signal levels of either conventional, continuous-wave modulated information signals, or TDMA composite-modulated information signals transmitted to the radiotelephone.

SUMMARY OF THE INVENTION

It is, accordingly, the object of the present invention to provide a gain control system for controlling signal levels of a signal received by a receiver operable to receive both continuous-wave and TDMA composite-modulated information signals.

It is a further object of the present invention to provide a gain control system, operable to control signal levels of a signal transmitted to a receiver either by conventional, continuous-wave modulation techniques, or by composite modulation techniques, which requires minimal power consumption for operation thereof.

It is yet a further object of the present invention to provide a dual-mode radiotelephone operable to receive both a conventional, continuous-wave information signal and a TDMA composite-modulated signal having gain control circuitry of minimal power requirements.

In accordance with the present invention, therefore, a gain control system for controlling signal levels of a signal received by a receiver is disclosed. First signal detection circuitry determines values of the signal levels of the signal received by the receiver when the signal is comprised of a constant envelope signal and generates a first gain control signal responsive to values of the signal levels determined thereby. Second signal detection circuitry determines values of the signal levels of the signals received by the receiver when the signal is comprised of a non-constant envelope signal, and generates a second gain control signal responsive to values of the signal levels determined thereby. The gain characteristics of the signal received by the receiver is adjusted responsive to the first gain control signal and the second gain control signal to control thereby the signal levels of the signals received by the receiver.

BRIEF DESCRIPTION OF THE DRAWINGS

The present invention will be better understood when read in light of the accompanying drawings in which:

FIGS. 2A and 2B are graphical representations of constant envelope signals wherein FIG. 2A is a frequency modulated signal representative of one such signal that may be utilized by the gain control system of the present invention, and FIG. 2B is a phase modulated signal representative of another such signal that may be utilized by the gain control system of the present invention;

DESCRIPTION OF THE PREFERRED EMBODIMENT

Figure 1:
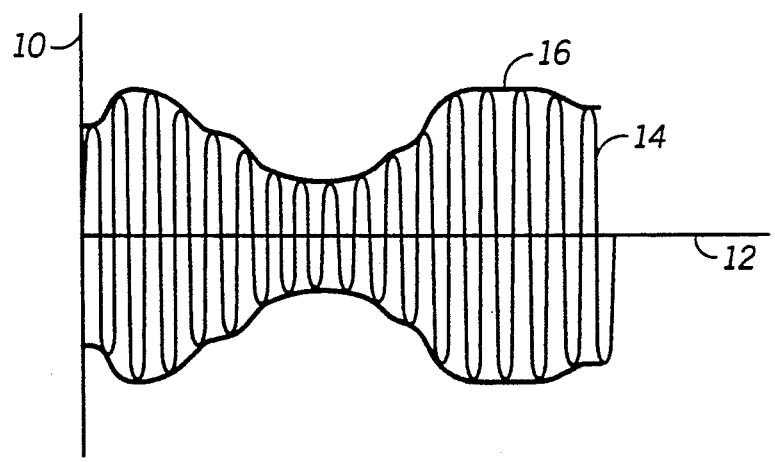
FIG. 1 is a graphical representation of an amplitude modulated information signal representative of one such signal which may be utilized by the gain control system of the present invention.
Figure 2A:
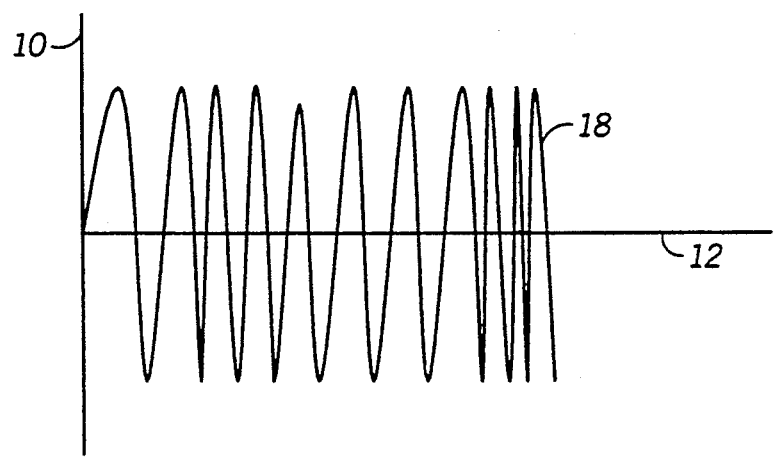
Figure 2B:
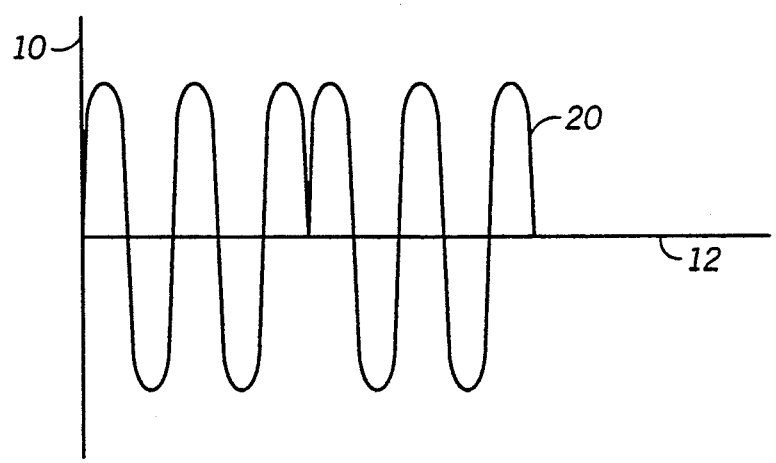

Turning first to graphical representation of the FIGS. 1, 2A-2B, waveforms representative of three types of modulated information signals are shown. The system of the present invention controls signal levels of a signal received by a receiver which are similar to the waveforms of FIGS. 1, 2A-2B (or, more particularly, a waveform similar to the waveform of FIG. 2A, and a waveform similar to the combination of FIG. 1 and FIG. 2B). The waveforms are actually plots of voltage, scaled in terms of millivolts, on ordinate axes 10 as a function of time, plotted along abscissa axes 12.

Waveform 14 of FIG. 1 is an amplitude modulated signal formed by modulating an information signal upon an electromagnetic wave wherein the amplitude (i.e., voltage) of the waveform 14 varies responsive to values of the information signal modulated thereupon. The information-bearing portion of waveform 14 is, thereby, contained in the amplitude of the waveform such that variations in the amplitude of the waveform 14 correspond to variations in the amplitude of the information signal. The amplitude of waveform 14, referred to as the envelope of the waveform, is represented in FIG. 1 by curve 16. Curve 16 is similar in shape to the information signal, which, when modulated upon an electromagnetic wave, forms waveform 14. Waveform 14 does not vary in frequency, and the frequency of waveform 14 corresponds to the frequency of the unmodulated wave (i.e., the carrier wave) upon which the information signal is modulated. Such frequency is referred to as the carrier frequency of waveform 14.

Waveform 18 of FIG. 2A is a frequency modulated signal formed by modulating an information signal upon an electromagnetic wave. The amplitude of waveform 18 does not vary. The frequency of waveform 18, however, varies responsive to values of the information signal modulated thereupon. Variations in frequency of waveform 18, thus, form the information-containing portion of the waveform. The variation in frequency of waveform 18 caused by modulation of the information signal upon the electromagnetic wave is, however, slight compared to the frequency of the electromagnetic wave. Hence, waveform 18 may, similar to the waveform 14 of FIG. 1, be characterized by the frequency of the electromagnetic wave (i.e., the carrier wave) upon which the information signal is modulated; such frequency is referred to as the carrier frequency of waveform 18.

Waveform 20 of FIG. 2B is a phase modulated signal formed by modulating an information signal upon an electromagnetic wave. The amplitude of waveform 20 does not vary. The phase of the waveform 20, however, varies responsive to values of the information signal modulated thereupon. Variations in phase of the waveform, thus, form the information-containing portion of waveform 20. It is to be noted that the abrupt phase change of waveform 20 of FIG. 2B is for purposes of illustration only. An actual phase modulated signal would exhibit a gradual phase change. The phase variation of waveform 20 does not significantly alter the carrier frequency of the signal. Therefore, waveform 20, once modulated, may (similar to waveform 14 of FIG. 1 and waveform 18 of FIG. 2A) is said to be characterized by the carrier frequency of the waveform.

Figure 3:
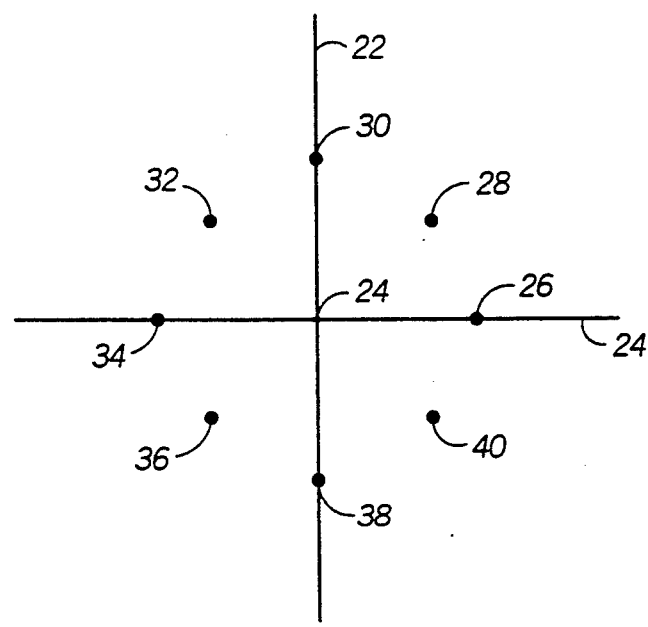
FIG. 3 is a graphical representation of the constellation points of a discrete encoding scheme which may be utilized to encode an information signal to form thereby a discrete encoded signal.

Turning now to the graphical representation of FIG. 3, the constellation points of a discrete encoding scheme for encoding an information signal are illustrated. As mentioned hereinabove, by encoding an information signal into a series of TDMA composite-modulated signals, more than one signal can be sequentially transmitted at a particular frequency to increase significantly thereby the information-transmission capacity of a particular frequency band.

FIG. 3 illustrates an eight-level phase shift keying (PSK) system in which an information signal may take the form of any of eight different levels (i.e., phases). Other discrete, encoding schemes, are of course, similarly possible. In this system, the information signal is encoded into two parallel bit streams referred to as I(t) and Q(t). At the sampling instant $t_i$, $I(t_i)$ $Q(t_i)$ form a vector whose possible values are graphically represented in FIG. 3 and referred to in the Figure by reference numerals 26-40. Ordinate axis 22 and abscissa axis 24 are scaled in terms of magnitude of Q(t) and I(t).

Such a vector may be modulated upon an electromagnetic wave to form thereby a composite modulated information signal wherein the information content of the signal is comprised of a series of discrete signal levels (or phases). The encoding scheme of FIG. 3 illustrates the standard selected for digital, cellular radiotelephone communication systems to be implemented in the United States. With particular respect to the United States standard, only four differential changes between any two sequential vectors are permitted. Such an encoding scheme is referred to as a differential quaternary phase shift keying (DQPSK) system.

Figure 4:
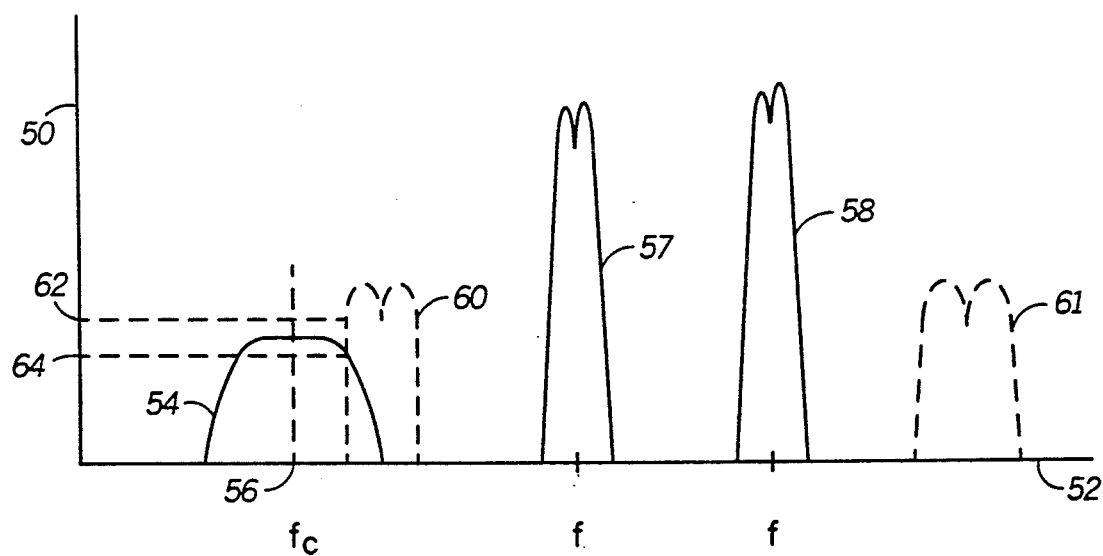
FIG. 4 is a graphical representation of a modulated information signal graphed as a function of frequency upon a particular transmission channel, and intermodulation spurs, graphed as a function of frequency, generated during down conversion of the received modulated information signal.

Turning now to the graphical representation of FIG. 4, a modulated information signal is plotted as a function of frequency wherein the level, i.e. amplitude, of the signal, scaled in terms of volts on ordinate axis 50 is graphed as a function of frequency, scaled in terms of hertz on abscissa axis 52. The energy of signal 54 is typically centered about a center frequency, $f_c$, of a particular frequency, and, as illustrated, is symmetrical about line 56, shown in hatch, defined by the center frequency. Typically, a receiver receives not only the desired, modulated information signal, represented here by waveform 54, but, additionally, other signals located at other frequencies close to waveform 54. For purposes of determining the information content of the desired modulated information signal, such signals are undesirable. Such signals are represented in the graph of FIG. 4 by waveforms 57 and 58. Mixing processes occurring during frequency conversion and amplification of the signals received by a receiver generate combinations of received signals, i.e., intermodulation spurs, which are represented in FIG. 4, in hatch, by spurs 60 and 61.

Intermodulation spurs may be of frequencies to interfere with the desired information signal. Such interference can prevent accurate determination of the information content of a received modulated information signal. Spur 60 is representative of such a spur which interferes with a desired information signal, and, as illustrated in the Figure, is of a frequency which interferes with waveform 54. In order to minimize interference caused by intermodulation spurs, receivers typically include filter circuitry for removing signals, represented in the Figure by waveforms 57 and 58, to prevent generation of intermodulation spurs, such as spur 60.

As noted previously, filter circuitry may be comprised of either passive or active filter components. A receiver operable to receive TDMA composite-modulated signals must further contain gain circuitry for maintaining the signal level of the received information signal within a desired range. Such a desired range is represented in FIG. 4 by lines 62 and 64. To maintain a signal level within such a range, the gain circuitry must amplify the signal when the received signal is of too small of a signal level, and attenuate the signal when the signal is of too great of a signal level.

As mentioned previously, a digital signal processor may be utilized to form a gain control circuitry for controlling signal levels of a signal received by a receiver. However, a digital signal processor requires a significant amount of power for operation thereof. Because TDMA composite-modulated signals are transmitted only intermittently, a digital signal processor need only be operated during those times in which the signal is received by the receiver.

While a digital signal processor may be utilized to form gain control circuitry to control the signal levels of a continuous-wave signal received by the receiver, the processor must be operated continuously, thereby requiring a significant amount of power for operation thereof.

Therefore, and as mentioned previously, the characteristics of gain control impose conflicting requirements for FM signals and TDMA composite modulated signals.

Figure 5:
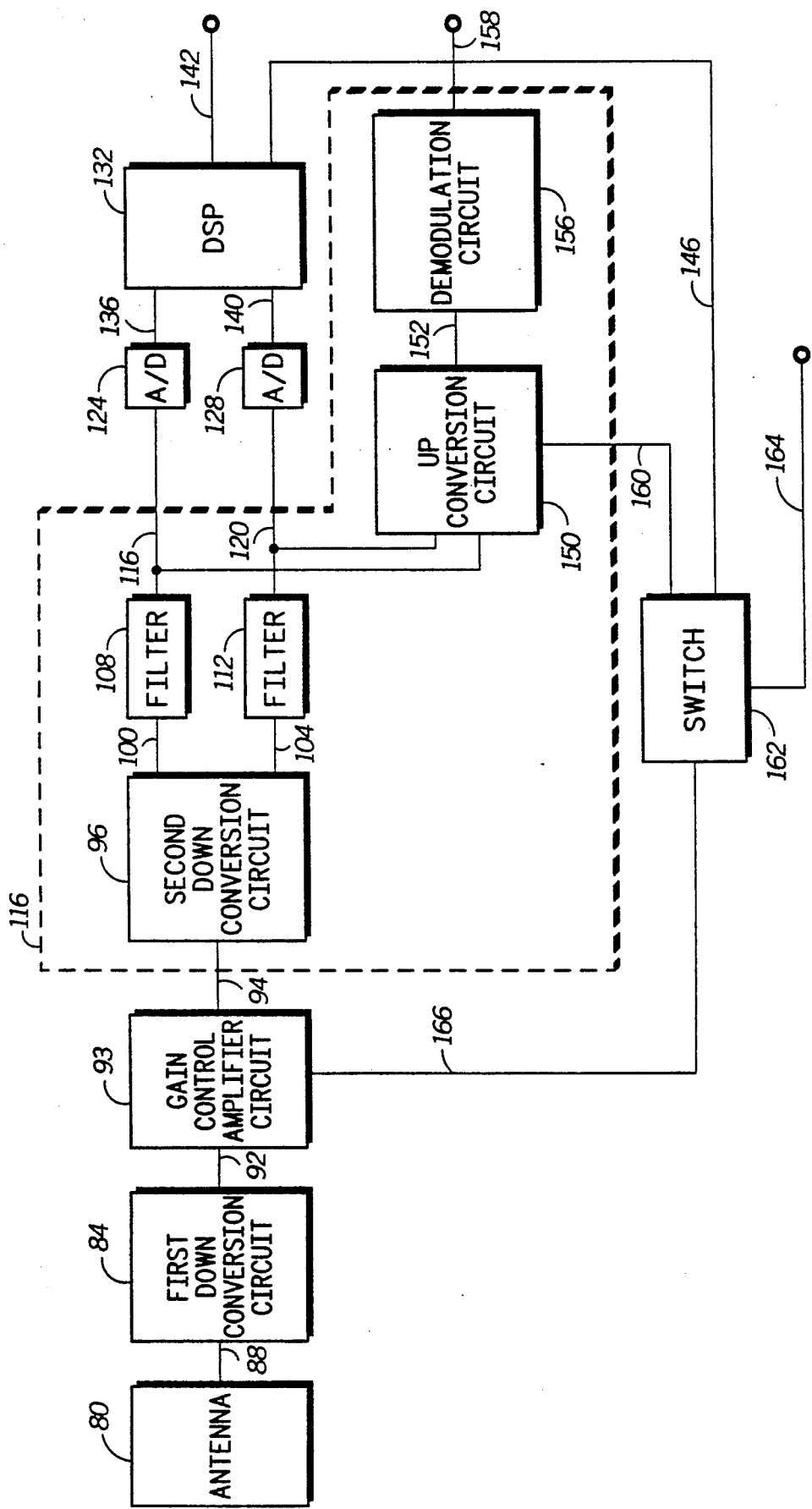
FIG. 5 is a block diagram of the gain control system of the present invention.

Turning now to the block diagram of FIG. 5, the elements of the gain control system of the present invention are shown in functional block form. The gain control system embodying the present invention is operative to control the signal levels of a signal received by a receiver when the signal is either a TDMA composite-modulated information signal, or a conventional, continuous wave, modulated information signal. A digital signal processor is operative only when the signal received by the receiver is a TDMA composite-modulated signal, thereby minimizing the power consumption of the processor.

The transmitted signal, either a conventional, continuous wave signal, or a TDMA composite modulated signal is transmitted to an antenna (or other electromagnetic wave receiving device) 80. The signal received by antenna 80 is filtered, and supplied to first down conversion circuit 84 on line 88. Down conversion circuit 84 converts the transmission frequency signal (which may, for example, be of 890 megahertz) into a signal of a lower frequency, such as, for example, 45 megahertz. Down conversion circuit circuit 84 generates the lower frequency signal on line 92 which is coupled to gain control amplifier circuit 93. (In other embodiments, gain control amplifier circuit 93 may be alternately positioned at other locations to perform a similar function.) Circuit 93 generates an amplified signal on line 94 which is supplied to second down conversion circuit 96. Second down conversion circuit 96 converts the signal supplied thereto on line 94 to baseband signals. Down conversion circuit 96 generates an in-phase signal on line 100 and a signal in quadrature therewith on line 104. The in-phase signal generated on line 100 is supplied to baseband filter 108, and the quadrature signal generated on line 104 is supplied to baseband filter 112. Down conversion circuit 96, and filters 108 and 112 may together comprise a portion of a single integrated circuit chip, referred to as a zero intermediate frequency (ZIF) circuit illustrated by block 116, shown in hatch.

Filtered signals generated by filters 108 and 112 are generated on lines 116 and 120, respectively. Filters 108 and 112 contain passbands to pass signals of desired frequencies.

When antenna 80 receives a TDMA composite modulated signal, the filtered signals generated by filters 108 and 112 are supplied to analog-to-digital converters 124 and 128, respectively. The digital signals generated by A/D converters 124 and 128 are supplied to digital signal processor (DSP) 132 on lines 136 and 140. Digital signal processor 132 processes the digital signal supplied thereto, and generates an audio signal on line 142 indicative of the information signal transmitted in TDMA composite modulated form to antenna 80. Digital signal processor 132 also generates a signal on line 146 responsive to the signal level of the signal received by antenna 80. The signal generated on line 146 may be utilized to control the signal levels of the signal received by the receiver and which are eventually reproduced on line 142.

When the signal transmitted to antenna 80 is a conventional, continuous wave signal, the filtered signals generated by filters 108 and 112 are supplied to up conversion circuit 150.

Up conversion circuit 150 converts the filtered in-phase and filtered quadrature phase signals generated on lines 116 and 120, respectively, to higher frequency signals, and adds the two components. The resultant signal is generated on line 152, and supplied to demodulation circuit 156. The signal generated on line 152 is supplied to demodulation circuit 156. The demodulation circuit 156 demodulates the signal supplied thereto by conventional frequency demodulation techniques. Conversion of the baseband signals generated on lines 116 and 120 into a higher frequency is required for demodulation by conventional demodulation circuitry.

Demodulation circuit 156 generates an audio signal on line 158 which is representative of the information signal portion of a conventional, continuous wave modulated signal received by antenna 80. As illustrated, up conversion circuit 150 and demodulation circuit 156 may additionally form a portion of ZIF circuit 116.

ZIF circuit 116 also supplies a signal on line 160 to switch 162. The signal generated on line 160 may be utilized to control the signal levels of the signal received by the receiver which are reproduced on line 158. The signal generated by digital signal processor 132 on line 146 is also supplied to switch 162.

Switch 162 alternately connects lines 160 and 146, and the signals transmitted thereon, with line 166 which is coupled to gain control amplifier circuit 93. Switch 162 is actuated by an external signal supplied thereto on line 164. When switch 162 is actuated to connect lines 146 and 166, the signal generated on line 146 is supplied to gain control amplifier circuit 93 to control the signal levels of the signal received by the receiver which is reproduced on line 142. When switch 162 is actuated to connect lines 160 and 166, the signal generated on line 160 is supplied to gain control amplifier circuit 93 to control the signal levels of the signal received by the receiver and which are eventually reproduced on line 158.

Figure 6:
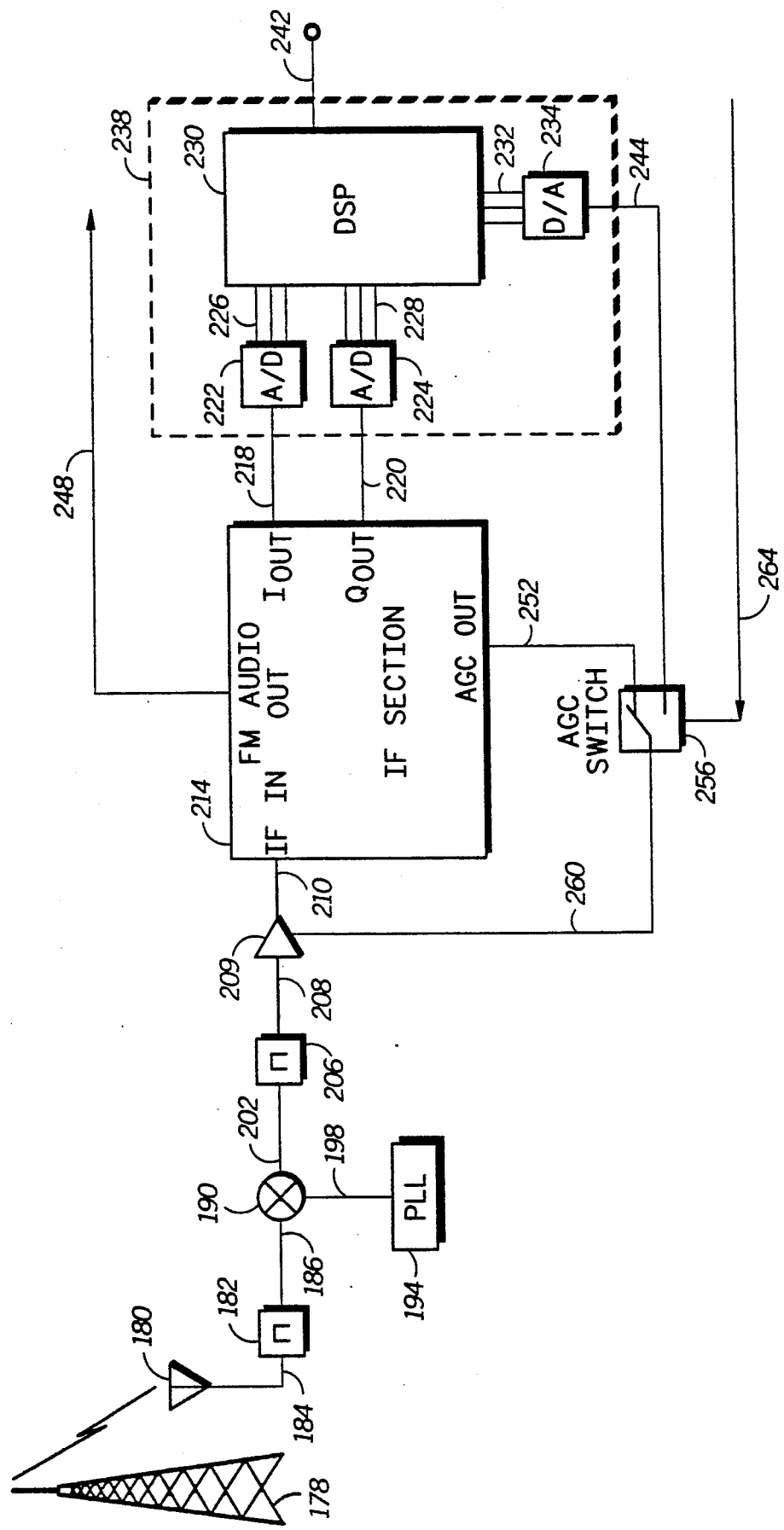
FIG. 6 is a partial schematic, partial block illustration of a preferred embodiment of the present invention.

Turning now to the partial block, partial schematic diagram of FIG. 6, a preferred embodiment of the automatic gain control system embodied by the present invention is shown. The gain control system embodying the present invention is operative to control the signal level of the signal received by the receiver when the signal is either a TDMA composite modulated information signal, or a conventional, continuous-wave modulated information signal. A digital signal processor utilized to form gain control circuitry is operative only when the signal received by the receiver is a composite modulated signal.

The transmitted signal, either a conventional, continuous-wave signal (e.g., an FM signal), or a TDMA composite modulated signal, is transmitted by a transmitter, here schematically indicated by transmitter tower 178, to an antenna (or other electromagnetic wave receiving device) 180. A signal received by antenna is supplied to filter 182 on line 184. Filter 182 filters the received signal. A filtered signal filtered by filter 182 is generated on line 186 and supplied to mixer 190.

Additionally supplied to mixer 190 is an oscillating signal generated by an oscillator forming a portion of a first phase locked loop (PLL) 194 on line 198. Mixer 190 generates a first down conversion signal on line 202. Mixer 190 converts the signal received by antenna 180 and filtered by filter 182 from a transmission frequency (which may, for example, be of 890 MHz) into a signal of a lower frequency, i.e., the first down conversion signal (which may, for example, be of 45 MHz).

Filter 206 filters the first down-conversion signal and generates a filtered signal on line 208 which is supplied to amplifier 209. Amplifier 209 generates a signal on line 210 which is supplied to IF input of zero intermediate frequency (ZIF) section 214. ZIF section 214 contains circuitry (not illustrated in the FIG. 6), to convert the first down-conversion signal supplied thereto on line 210 into filtered, baseband signals. The internal circuitry which converts the first down-conversion signal into the baseband signals generates an in-phase signal, I, on line 218, and a signal in phase quadrature therewith, Q, on line 220.

When antenna 180 receives a discrete, encoded signal, the I and Q signals generated on lines 218 and 220 are supplied to analog-to-digital converters 222 and 224, respectively. A/D converters 222 and 224 generate digital signals on lines 226 and 228, respectively. For purposes of illustration, three lines 226 and 228 connect each A/D converter 222 and 224 to digital signal processor 230.

Digital signal processor 230, in the preferred embodiment, contains an algorithm to perform gain control functions, and, additionally, an algorithm to perform the function of an equalizer. Digital signal processor 230 generates output signals on lines 232 which are supplied to digital-to-analog converter 234. (Again, for purposes of illustration, three lines 232 connect digital signal processor 230 to D/A converter 234). A/D converters 222 and 224, digital signal processor 230, and D/A converters 234 may together form a single integrated circuit forming a DSP, illustrated by block 238, shown in hatch.

Digital signal processor 230 generates an output signal on line 242 indicative of the information signal transmitted in composite modulated form to antenna 180. Digital signal processor 230 also generates signals on lines 232 which are supplied to D/A converter 234. D/A converter 234 generates a signal on line 244 responsive to the signal level of the signal received by antenna 180. The signal generated on line 244 may be utilized to control the signal levels of the signal received by the receiver which are reproduced on line 242.

When the signal transmitted to antenna 180 is a conventional, continuous-wave signal, such as a conventional FM signal, circuitry internal to ZIF section 214 demodulates the received signal and generates an audio signal on line 248 which is representative of the information signal portion of the continuous-wave signal received by antenna 180.

ZIF section 214 further contains circuitry internal thereto (not illustrated in the diagram of FIG. 6) for generating an output at AGC output 252 indicative of the signal level of a signal received by antenna 180.

Lines 244 and 252 containing signals indicative of the signal levels of the signal received by antenna 180 when the signal is a TDMA composite modulated information signal or a conventional, continuous-wave modulated information signal, respectively, are supplied to switch 256. Switch 256 may be comprised of a 2:1 multiplexer. Switch 256 alternately couples line 244 to amplifier 209 on line 260, or line 252 to amplifier 209 on line 260. Switch 256 is actuated by a signal supplied thereto on line 264. In the preferred embodiment of the present invention, the control signal is supplied to the receiver by a logic section of the radiotelephone.

When the signal supplied on 264 actuates switch 256 such that line 252 is coupled to line 260, thereby connecting the AGC out of ZIF section 214 to amplifier 209, the control signal generated internal to ZIF section 214 is utilized to control the signal level of the signal received by the receiver. Alternately, when the signal supplied on line 264 actuates switch 256 such that line 244 is coupled to line 260, thereby connecting the output of the digital signal processor 230 to amplifier 209, the control signal generated by the digital signal processor 230 is utilized to control the signal levels of the signal received by the receiver.

Figure 7:
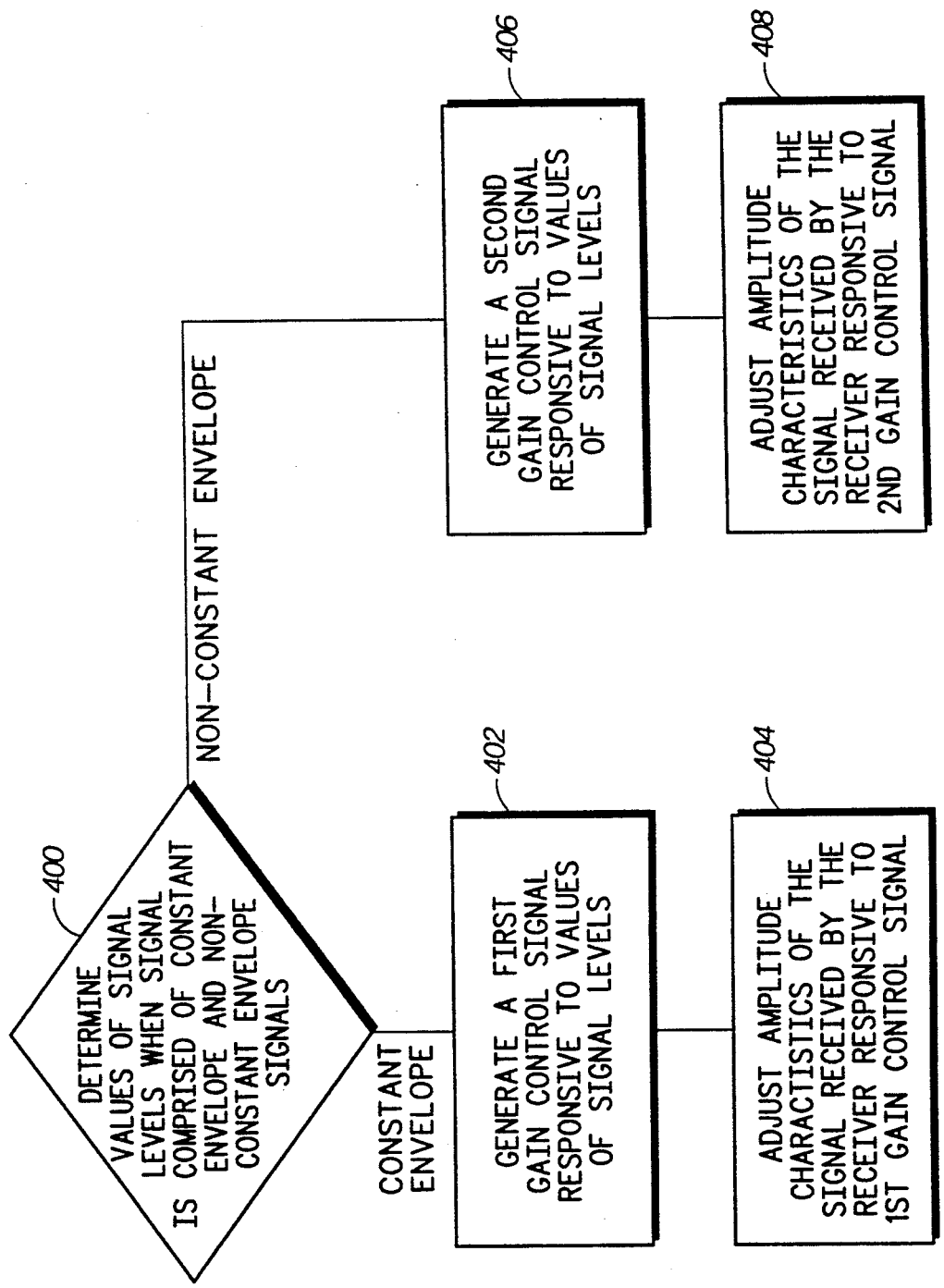
FIG. 7 is a flow diagram representing the method of the present invention.

Turning now to the flow diagram of FIG. 7, the method steps of the method of present invention are shown. The method of the present invention controls signal levels of a signal received by a receiver. First, and as illustrated by decision block 400, the values of the signal levels of the signal received by the receiver when the signal is comprised of either a conventional, constant envelope signal or a non-constant envelope signal are determined.

When the signal received by the receiver is a conventional constant envelope signal, a branch is taken to block 402, and a first gain control signal responsive to values of the signal levels of the signal received by the receiver when the signal is comprised of a constant envelope signal is generated. Next, and as illustrated by block 404, the amplitude characteristics of the signal received by the receiver responsive to the first gain control signal are adjusted.

When the signal received by the receiver is a non-constant envelope signal, a branch is taken to block 406, and a second gain control signal responsive to values of the signal levels of the signal received by the receiver when the signal is comprised of a non-constant envelope signal is generated. Next, and as illustrated by block 408, the amplitude characteristics of the signal received by the receiver responsive to the second gain control signal are adjusted.

While the present invention has been described in connection with the preferred embodiments of the various figures, it is to be understood that other similar embodiments may be used and modifications and additions may be made to the described embodiments for performing the same function of the present invention without deviating therefrom. Therefore, the present invention should not be limited to any single embodiment, but rather construed in breadth and scope in accordance with the recitation of the appended claims.

What is claimed is:

1. A gain control system for controlling signal levels of a signal received by a receiver, said gain control system comprising:

first down-conversion circuitry for converting the signal received by the receiver into a first down-converted signal of an intermediate frequency and of signal level magnitudes representative of signal level magnitudes of the signal received by the receiver;

variable amplifier circuitry coupled to receive the first down-converted signal generated by the first down-conversion circuitry, said variable amplifier circuitry for generating an amplified signal of the intermediate frequency at an amplification level corresponding to a gain coefficient of the variable amplifier circuitry;

second down-conversion circuitry coupled to receive the amplified signal for converting the amplified signal of the intermediate frequency generated by said variable amplifier circuitry into a baseband signal of signal level magnitudes representative of signal level magnitudes of the signal received by the receiver;

first signal detection circuitry, coupled to receive the baseband signal generated by said second down-conversion circuitry, having means for converting the baseband signal upward in frequency to form an upconverted signal, and means, coupled to receive the upconverted signal, for determining values of the signal levels of the signal received by the receiver when said signal is comprised of a constant envelope signal and for generating a first gain control signal responsive to values of the signal levels determined thereat;

second signal detection circuitry, coupled to receive the baseband signal generated by said second down-conversion circuitry, for determining values of the signal levels of said signal received by the receiver when the signal is comprised of a non-constant envelope signal, the second signal detection circuitry formed thereby having, as a portion thereof, a digital signal processor, operative during times in which the signal received by the receiver is comprised of the non-constant envelope signal and non-operative during times in which the signal received by the receiver is comprised of the constant envelope signal, and for generating a second gain control signal responsive to values of the signal levels determined thereat; and means for alternately applying either the first gain control signal or the second gain control signal to the variable amplifier circuitry thereby to adjust the gain coefficient of the variable amplifier circuitry.

2. The gain control system of claim 1 wherein said means for applying comprises means forming a switch for applying either the first gain control signal or the the second gain control signal to the variable amplifier circuitry.

3. The gain control system of claim 2 wherein said switch formed by the means for applying is actuated by a signal transmitted to the receiver.

4. The gain control system of claim 2 wherein said switch formed by the means for applying comprises a multiplexer.

5. The gain control system of claim 1 wherein said constant envelope signal comprises a frequency modulated signal.

6. The gain control system of claim 1 wherein said non-constant envelope signal comprises a composite modulated signal.

7. The gain control system of claim 1 wherein said second down-conversion circuitry for converting the amplified signal generated by the variable amplifier circuitry into the baseband signal comprises a zero intermediate frequency down conversion section.

8. The gain control system of claim 7 wherein said zero intermediate frequency down conversion section generates an analog output signal indicative of the signal received by the receiver.

9. The gain control system of claim 7 wherein said zero intermediate frequency down conversion section generates a signal corresponding to in phase and quadrature components of the signal received by the receiver.

10. The gain control system of claim 9 wherein said digital signal processor of the second signal detection circuitry is coupled to receive the in phase and quadrature components, respectively, generated by the zero intermediate frequency down conversion section.

11. The gain control system of claim 10 wherein the digital signal processor embodies an algorithm for calculating desired levels of the second gain control signal.

12. The gain control system of claim 10 wherein the digital signal processor further comprises a software equalizer.

13. The gain control system of claim 1 wherein said variable amplifier circuitry forms a portion of a zero intermediate filter.

14. The gain control system of claim 13 wherein either said first gain control signal or said second gain control signal is supplied to an input of the zero intermediate filter.

15. A dual mode transceiver operable to receive both a constant envelope modulated signal and a non-constant envelope modulated signal, said transceiver comprising:

first down-conversion circuitry for converting the signal received by the receiver into a first down-converted signal of an intermediate frequency and of signal level magnitudes representative of signal level magnitudes of the signal received by the receiver;

variable amplifier circuitry coupled to receive the first down-converted signal generated by the first down-conversion circuitry, said variable amplifier circuitry for generating an amplified signal of the intermediate frequency at an amplification level corresponding to a gain coefficient of the variable amplifier circuitry;

second down-conversion circuitry, coupled to receive the amplified signal, for converting the amplified signal of the intermediate frequency generated by said variable amplifier circuitry into a baseband signal of signal level magnitudes representative of signal level magnitudes of the signal received by the receiver;

first signal detection circuitry, coupled to receive the baseband signal generated by said second down-conversion circuitry, having means for converting the baseband signal upward in frequency to form an upconverted signal, and means, coupled to receive the upconverted signal, for determining values of the signal levels of the signal received by the receiver when said signal is comprised of the constant envelope signal and for generating a first gain control signal responsive to values of the signal levels determined thereat;

second signal detection circuitry, coupled to receive the baseband signal generated by said second down-conversion circuitry, for determining values of the signal levels of said signal received by the receiver when the signal is comprised of the non-constant envelope signal, the second signal detection circuitry formed thereby having, as a portion thereof, a digital signal processor, operative during times in which the signal received by the receiver is comprised of the non-constant envelope signal and non-operative during times in which the signal received by the receiver is comprised of the constant envelope signal, and for generating a second gain control signal responsive to values of the signal levels determined by the second signal detection circuitry; and a switch coupled to receive both the first gain control signal and the second gain control signal, and operative to apply the first gain control signal to the variable amplifier circuitry when the signal received by the receiver is comprised of the constant envelope signal and, alternately, to apply the second gain control signal to the variable amplifier circuitry when the signal received by the receiver is comprised of the non-constant envelope signal.

16. A method for controlling signal levels of a signal received by a receiver, said method comprising the steps of:

converting the signal received by the receiver into a first down-converted signal of an intermediate frequency and of signal level magnitudes representative of the signal level magnitudes of the signal received by the receiver;

applying the first down-converted signal to variable amplifier circuitry to generate thereby an amplified signal of the intermediate frequency at an amplification level corresponding to a gain coefficient of the variable amplifier circuitry;

converting the amplified signal of the intermediate frequency into a baseband signal of signal level magnitudes representative of signal level magnitudes of the signal received by the receiver;

when the signal received by the receiver is comprised of a constant envelope signal, converting the baseband signal upward in frequency to form an upconverted signal, and then determining values of the signal levels of the signal received by the receiver responsive to values of the upconverted signal;

generating a first gain control signal responsive to determined values of the signal levels of the signal received by the receiver when the signal is comprised of the constant envelope signal;

when the signal received by the receiver is comprised of a non-constant envelope signal, determining values of the signal levels of the signal received by the receiver responsive to values of the upconverted signal;

generating a second gain control signal only during times in which the signal received by the receiver comprises the non-constant envelope signal responsive to determined values of the signal levels of the signal received by the receiver; and adjusting the gain coefficient of the variable amplifier circuitry responsive to either the first gain control signal when the signal received by the receiver is comprised of the constant-envelope signal or the second gain control signal when the signal received by the receiver is comprised of the non-constant envelope signal.

17. The method of claim 16 wherein said constant envelope signal comprises a frequency modulated signal.

18. The method of claim 16 wherein said non-constant envelope signal comprises a composite modulated signal.

* * * * *